(12) United States Patent
Higashi et al.

(10) Patent No.: US 12,358,016 B2
(45) Date of Patent: Jul. 15, 2025

(54) CUP, LIQUID PROCESSING APPARATUS, AND LIQUID PROCESSING METHOD

(71) Applicant: Tokyo Electron Limited, Tokyo (JP)

(72) Inventors: Ryunosuke Higashi, Koshi (JP); Kenji Yada, Koshi (JP); Yoshihiro Imura, Koshi (JP); Kohei Kawakami, Koshi (JP); Yuhei Maeda, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 96 days.

(21) Appl. No.: 18/490,119

(22) Filed: Oct. 19, 2023

(65) Prior Publication Data

US 2024/0131554 A1 Apr. 25, 2024
US 2024/0226954 A9 Jul. 11, 2024

(30) Foreign Application Priority Data

Oct. 20, 2022 (JP) ................. 2022-168579

(51) Int. Cl.
  *B05C 11/11* (2006.01)
  *B05C 11/10* (2006.01)
  (Continued)

(52) U.S. Cl.
  CPC ........... *B05C 11/11* (2013.01); *B05C 11/1039* (2013.01); *G03F 7/162* (2013.01);
  (Continued)

(58) Field of Classification Search
  CPC ........... H01L 21/6715; H01L 21/67051; H01L 21/67017; H01L 21/67023; H01L 21/0271; G03F 7/162; B05C 11/11; B05C 11/1039
  See application file for complete search history.

(56) References Cited

U.S. PATENT DOCUMENTS 5,260,174 A * 11/1993 Nakazawa ............... G03F 7/162
                                                    430/326
5,417,763 A *  5/1995 Diepens .................... G11B 7/26
                                                    118/321

(Continued)

FOREIGN PATENT DOCUMENTS

JP        2014-151249 A    8/2014

*Primary Examiner* — William M McCalister
(74) *Attorney, Agent, or Firm* — Chrisman Gallo Tochtrop LLC

(57) ABSTRACT

A cup includes a flow passage forming member forming a first exhaust passage, a scattered substance collection passage configured to collect a scattered substance from a substrate, and a second exhaust passage in sequence as going upwards; a joint exhaust passage connected to each of the first exhaust passage, the scattered substance collection passage, and the second exhaust passage; a first annular member included in the flow passage forming member, the scattered substance collection passage and the first exhaust passage being formed above and below the first annular member, respectively; and a communication hole provided in the flow passage forming member to allow the scattered substance collection passage and the joint exhaust passage to communicate with each other such that a pressure loss of the communication hole is large as compared to a pressure loss in a gap formed between the first annular member and the substrate.

13 Claims, 11 Drawing Sheets

(51) Int. Cl.
*G03F 7/16* (2006.01)
*H01L 21/027* (2006.01)
*H01L 21/67* (2006.01)

(52) U.S. Cl.
CPC .. *H01L 21/67017* (2013.01); *H01L 21/67023* (2013.01); *H01L 21/6715* (2013.01); *H01L 21/0271* (2013.01); *H01L 21/67051* (2013.01)

(56) References Cited

U.S. PATENT DOCUMENTS

| | | | | |
|---|---|---|---|---|
| 5,776,250 | A * | 7/1998 | Shin | B08B 3/02 |
| | | | | 118/52 |
| 5,863,328 | A * | 1/1999 | Sichmann | B05C 11/1039 |
| | | | | 118/500 |
| 6,096,233 | A * | 8/2000 | Taniyama | H01L 22/26 |
| | | | | 438/748 |
| 6,159,291 | A * | 12/2000 | Morita | B05B 15/72 |
| | | | | 118/321 |
| 6,589,338 | B1 * | 7/2003 | Nakamori | H01L 21/67051 |
| | | | | 257/E21.228 |
| 6,767,403 | B1 * | 7/2004 | Chetcuti | H01L 21/6715 |
| | | | | 118/500 |
| 7,171,973 | B2 * | 2/2007 | Orii | H01L 21/67178 |
| | | | | 134/182 |
| 7,681,581 | B2 * | 3/2010 | Rose | H01L 21/67017 |
| | | | | 134/151 |
| 7,793,610 | B2 * | 9/2010 | Akimoto | H01L 21/68728 |
| | | | | 118/52 |
| 7,862,661 | B2 * | 1/2011 | Kappler | H01L 21/67721 |
| | | | | 427/350 |
| 8,042,560 | B2 * | 10/2011 | Ito | H01L 21/68728 |
| | | | | 118/52 |
| 8,235,062 | B2 * | 8/2012 | Lauerhaas | H01L 21/67017 |
| | | | | 422/292 |
| 8,567,339 | B2 * | 10/2013 | Higashijima | H01L 21/6708 |
| | | | | 118/728 |
| 8,684,015 | B2 * | 4/2014 | Lauerhaas | H01L 21/67017 |
| | | | | 134/182 |
| 9,233,390 | B2 * | 1/2016 | Sugiyama | B05C 5/00 |
| 10,707,099 | B2 * | 7/2020 | Breingan | H01L 21/6708 |
| 11,342,215 | B2 * | 5/2022 | Breingan | H01L 21/67109 |
| 2003/0101928 | A1 * | 6/2003 | Chuang | H01L 21/6715 |
| | | | | 118/52 |
| 2004/0050491 | A1 * | 3/2004 | Miya | H01L 21/67051 |
| | | | | 156/345.11 |
| 2004/0226655 | A1 * | 11/2004 | Kajino | H01L 21/67051 |
| | | | | 156/345.11 |
| 2005/0244579 | A1 * | 11/2005 | Matsuzawa | H01L 21/67051 |
| | | | | 118/52 |
| 2014/0060424 | A1 * | 3/2014 | Sugiyama | B05C 5/00 |
| | | | | 118/52 |
| 2024/0226954 | A9 * | 7/2024 | Higashi | H01L 21/67051 |

* cited by examiner

CUP, LIQUID PROCESSING APPARATUS, AND LIQUID PROCESSING METHOD

CROSS-REFERENCE TO RELATED APPLICATION

This application claims the benefit of Japanese Patent Application No. 2022-168579 filed on Oct. 20, 2022, the entire disclosure of which is incorporated herein by reference.

TECHNICAL FIELD

The various aspects and embodiments described herein pertain generally to a cup, a liquid processing apparatus, and a liquid processing method.

BACKGROUND

In a manufacturing process for a semiconductor device, a processing is performed by supplying various kinds of processing liquids to a semiconductor wafer (hereinafter, simply referred to as a wafer). Patent Document 1 discloses an apparatus for forming a resist film by supplying resist to a wafer accommodated in a cup.

Patent Document 1: Japanese Patent Laid-open Publication No. 2014-151249

SUMMARY

In one exemplary embodiment, a cup, surrounding a substrate which is disposed in a placing unit and to which a processing liquid is supplied, configured to be evacuated includes a flow passage forming member forming, on a peripheral side of the cup with respect to the substrate within the cup, a first exhaust passage, a scattered substance collection passage configured to collect a scattered substance from the substrate, and a second exhaust passage, which are separated from each other, in sequence as going upwards, each of the first exhaust passage, the scattered substance collection passage and the second exhaust passage being an annular passage opened toward a central axis side of the cup; a joint exhaust passage connected to each of the first exhaust passage, the scattered substance collection passage, and the second exhaust passage such that the first exhaust passage, the scattered substance collection passage, and the second exhaust passage are evacuated simultaneously toward the peripheral side of the cup, the joint exhaust passage being disposed below the substrate within the cup; a first annular member included in the flow passage forming member, and formed along an outer periphery of the substrate, the scattered substance collection passage and the first exhaust passage being formed above and below the first annular member, respectively; and a communication hole provided in the flow passage forming member to allow the scattered substance collection passage and the joint exhaust passage to communicate with each other such that a pressure loss of the communication hole is large as compared to a pressure loss in a gap formed between the first annular member and the substrate.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
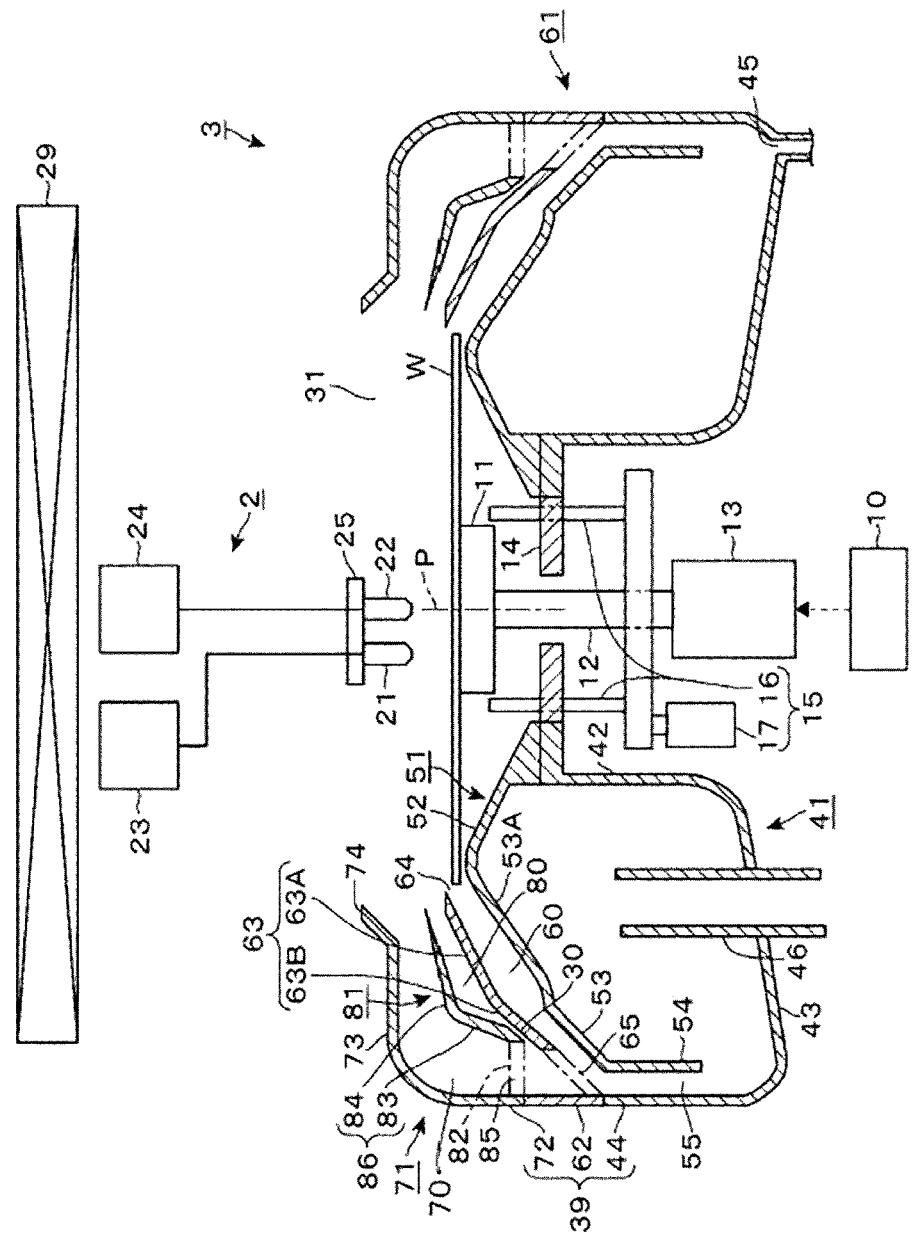
FIG. 1 is a longitudinal side view of a resist film forming apparatus equipped with a cup according to a first exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First Exemplary Embodiment

A resist film forming apparatus 1 equipped with a cup 3 according to a first exemplary embodiment will be described with reference to a longitudinal side view of FIG. 1 and a plan view of FIG. 2. The resist film forming apparatus 1 as an example of a liquid processing apparatus is configured to form a resist film by coating thinner and resist in sequence on a surface of a wafer W by spin coating. The thinner and the resist are processing liquids for the wafer W, and the thinner is a modifying liquid configured to enhance the wettability of the surface of the wafer W with respect to the resist. The wafer W is a circular substrate and has a diameter of, e.g., 300 mm. The resist film forming apparatus 1 includes a processing liquid supply mechanism 2, a cup 3, a spin chuck 11, a rotation mechanism 13, and a wafer delivery mechanism 15, and performs a processing on the wafer W that is accommodated in and surrounded by the cup 3.

The spin chuck 11 is provided in the cup 3 with an open top. The spin chuck 11 is a placing unit configured to place the wafer W thereon, and holds the wafer W horizontally by attracting a central portion of a bottom surface of the wafer W placed thereon. The spin chuck 11 is connected to the rotation mechanism 13 via a shaft 12 that extends vertically. The wafer W held on the spin chuck 11 is rotated about a vertical axis by the rotation mechanism 13. The shaft 12 penetrates a circular plate 14 that is disposed horizontally.

The wafer delivery mechanism 15 includes three lift pins 16 and an elevating mechanism 17. The three lift pins 16 surround the shaft 12, and each of these lift pins 16 is provided so as to extend vertically through the circular plate 14 and can be moved up and down by the elevating mechanism 17. Upper ends of the lift pins 16 are protruded above the cup 3 when the lift pins 16 are raised, so that the wafer W can be transferred between the spin chuck 11 and a non-illustrated transfer mechanism.

The processing liquid supply mechanism 2 will be described. The processing liquid supply mechanism 2 is equipped with a resist supply nozzle 21, a thinner supply nozzle 22, a resist supply 23, a thinner supply 24, an arm 25, a moving mechanism 26, a guide 27, and a standby unit 28. The resist supply nozzle 21 is configured to discharge the resist pressure-fed from the resist supply 23 vertically downwards. The thinner supply nozzle 22 is configured to discharge the thinner pressure-fed from the thinner supply 24 vertically downwards. Each of the resist supply 23 and the thinner supply 24 includes a pump and a valve, so they can respectively force-feed the resist and thinner at a required timing.

The resist supply nozzle 21 and the thinner supply nozzle 22 are supported on a leading end side of the arm 25. A base end side of the arm 25 is connected to the moving mechanism 26. The moving mechanism 26 is movable horizontally along the guide 27, and is capable of moving the arm 25 up and down. The standby unit 28 opened upwards is provided outside the cup 3. The resist supply nozzle 21 and the thinner supply nozzle 22 are moved by the moving mechanism 26 between the inside of the opening of the standby unit 28 and the inside of the cup 3 to supply the resist and the thinner onto a central portion of the wafer W. In FIG. 1, a reference numeral 29 represents an air supply, which is disposed above the cup 3 so as not to interfere with the arm 25 when the arm 25 is moved, and this air supply 29 serves to supply clean air downwards.

In addition, the resist film forming apparatus 1 includes a controller 10. The controller 10 is implemented by a computer, and includes a program. Process groups are organized in this program so that a series of operations may be performed in the resist film forming apparatus 1. The controller 10 outputs control signals to individual components of the resist film forming apparatus 1 according to the program, whereby the operations of the individual components are controlled. Specifically, rotation of the spin chuck 11 by the rotation mechanism 13, elevation of the lift pins 16 by the elevating mechanism 17, supply of the processing liquids from the resist supply 23 and the thinner supply 24 to the respective nozzles, movement of the respective nozzles by the moving mechanism 26, and so forth are controlled by the control signals. The program is installed in the controller 10 while being stored in a recording medium such as, but not limited to, a compact disk, a hard disk, a DVD, or the like.

Now, the cup 3 will be explained. During the processing of the wafer W, the inside of the cup 3 is evacuated, and the air supplied from the air supply 29 is sucked in, suppressing a liquid (including mist) from being scattered to the outside of the cup 3 from the wafer W. By the suction of the air, an airflow is formed in the cup 3, and a flow passage (exhaust passage) is formed in the cup 3 to control the airflow around the wafer W to thereby improve uniformity of a film thickness of a resist film within the surface of the wafer W.

Figure 2:
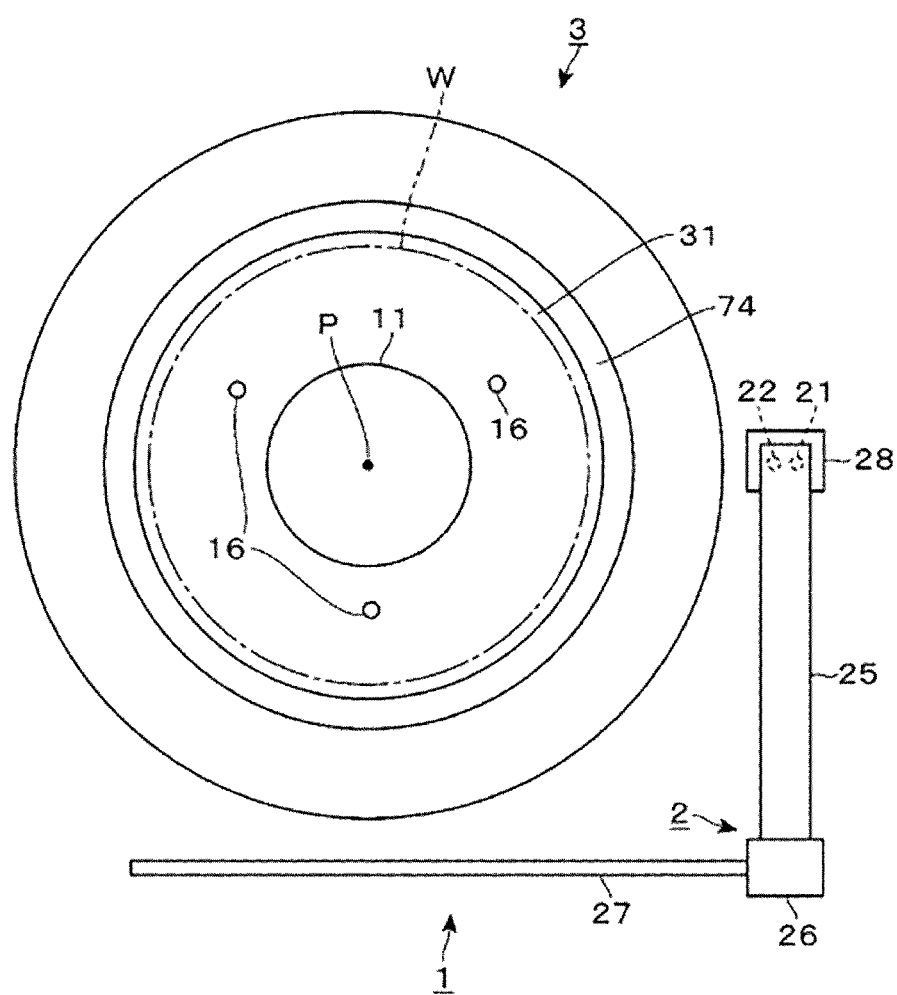
FIG. 2 is a plan view of the resist film forming apparatus.

In FIG. 1 and FIG. 2, a central axis of the cup 3 is marked by P. A rotation center of the spin chuck 11 lies on the central axis P, and the wafer W is placed on the spin chuck 11 such that its center is located on the central axis P. The cup 3 has a circular shape with an opening 31 at the top, a sidewall 39, and a bottom wall 43, and is rotationally symmetrical with respect to the central axis P.

Figure 3:
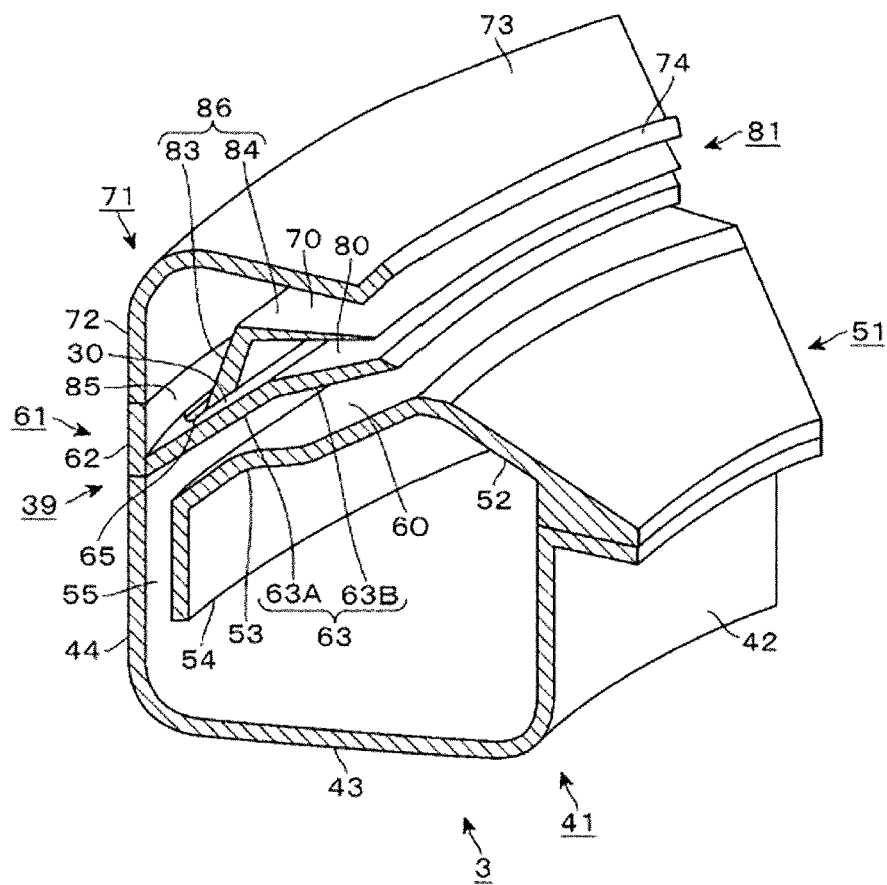
FIG. 3 is a longitudinal perspective view of the cup.

In the following description, reference is made to a longitudinal perspective view of FIG. 3 as well, which illustrates a part of the cup 3 in a circumferential direction thereof. The cup 3 is formed by combining a plurality of annular members such that the centers of these annular members coincide with the central axis P. The relative positions of the annular members are fixed. These annular members thus combined and fixed to each other will be respectively called an under cup 41, an inner cup 51, a middle cup 61, an upper cup 71, and a sub-edge ring 81.

The under cup 41 forms the bottom wall 43 and a lower portion of the sidewall 39 of the cup 3. This under cup 41 has an inner cylindrical portion 42 extending vertically downwards from an outer side of the circular plate 14, and an upper end of this inner cylindrical portion 42 is connected to the circular plate 14. A lower end of the inner cylindrical portion 42 widens outwards and downwards to form the bottom wall 43 of the cup 3, and a top surface of the bottom wall 43 forms a relatively gentle slope with a peripheral side thereof descending. An outer periphery of the bottom wall 43 extends vertically upwards to form an outer cylindrical portion 44. The sidewall 39 of the cup 3 is formed by this outer cylindrical portion 44, a cylindrical portion 72 of the upper cup 71 to be described later, and a cylindrical portion 62 of the middle cup 61 to be described later. A drain port 45 is opened at a peripheral portion of the bottom wall 43. An exhaust pipe 46 standing upright is provided in the bottom wall 43 to be located at an inner side (on the central axis P side) than a position where the drain port 45 is opened, and an exhaust port formed by this exhaust pipe 46 is opened above the bottom wall 43.

Now, the inner cup 51 will be described. An inner peripheral portion of the inner cup 51 is supported on the inner cylindrical portion 42 of the under cup 41. A plate-shaped member is extended from the inner peripheral portion supported in this way toward a peripheral side (sidewall 39 side) of the cup 3, and an inner inclined portion 52 and an outer inclined portion 53 each having an annular shape are formed by the plate-shaped member. The inner inclined portion 52 is formed so as to rise as it goes toward the peripheral side of the cup 3. The outer inclined portion 53 is located closer to the peripheral side of the cup 3 than the inner inclined portion 52 is, and is formed so as to descend as it goes toward the peripheral side of the cup 3. Therefore, the inner inclined portion 52 and the outer inclined portion 53 have a mountain shape in a longitudinal side view, and the top of this mountain is located below a peripheral portion of the wafer W held by the spin chuck 11.

An upper portion of the outer inclined portion 53 is curved so as to be slightly recessed in a downwardly oblique direction, so that it has a bow shape in a longitudinal sectional view. If this bow-shaped curved portion is referred to as a curved portion 53A, a lower portion of the outer inclined portion 53 extends obliquely downwards in a straight line shape from a lower end of the curved portion 53A toward the peripheral side of the cup 3 in the longitudinal sectional view. Accordingly, an inclined surface (top surface) of the outer inclined portion 53 is formed so as to be gently inclined with respect to a horizontal plane on the way and then inclined slightly sharply at an outer peripheral end thereof, when viewed toward the peripheral side of the cup 3. The processing liquid flowing down from the wafer W is guided toward the peripheral side of the cup 3 and then toward a joint exhaust passage 55 to be described later along this inclined top surface of the outer inclined portion 53.

A cylindrical portion 54 is formed so as to extend vertically downwards from a peripheral end of the outer inclined portion 53, and this cylindrical portion 54 is located closer to the peripheral side of the cup 3 than the exhaust pipe 46 is. An outer surface of this cylindrical portion 54 faces an inner surface of the outer cylindrical portion 44 of the under cup 41 while being distanced apart therefrom. A space between the outer cylindrical portion 44 and the cylindrical portion 54 forms an exhaust passage located below the wafer W. This exhaust passage constitutes the joint exhaust passage 55 into which exhaust flows from respective separated regions in the cup 3 are introduced, as will be described later. The exhaust flows having passed through this joint exhaust passage 55 are introduced into the exhaust pipe 46. To suppress an inflow of a liquid, the exhaust pipe 46 is opened upwards to be higher than a lower end of the cylindrical portion 54 of the inner cup 51.

Now, the middle cup 61 will be discussed. The middle cup 61 has a vertically extending cylindrical portion 62, and this cylindrical portion 62 is supported on the inner cylindrical portion 42 of the under cup 41. A lower inner surface of this cylindrical portion 62 is extended upwards toward the central axis P of the cup 3, thus forming a middle cup main body 63, which is a first annular member.

The middle cup main body 63 is an annular plate located above the inner cup 51. A space between the middle cup main body 63 and the inner cup 51 is formed as a lower exhaust passage 60. The lower exhaust passage 60 is an annular exhaust passage opened toward the central axis P and connected to the joint exhaust passage 55. The lower exhaust passage 60 is evacuated toward the peripheral side of the cup 3 through the evacuation of the joint exhaust passage 55 by the exhaust pipe 46. An inner peripheral end of the middle cup main body 63 is close to a peripheral end of the wafer W held by the spin chuck 11 at a certain distance therebetween. Therefore, an annular gap 64 is formed between the inner peripheral end of the middle cup main body 63 and the peripheral end of the wafer W, and this gap 64 serves as an inlet for an airflow into the lower exhaust passage 60. Additionally, a plurality of through holes 65 is vertically formed at a peripheral portion of the middle cup main body 63 at a certain distance therebetween in the circumferential direction, forming an exhaust passage.

Since the middle cup main body 63 is disposed close to the peripheral end of the wafer W as described above, an airflow formed above a peripheral end portion of the wafer W is suppressed from becoming largely different from an airflow formed above a center side of the wafer W, thus suppressing a deviation in film thickness of the resist film formed on the wafer W between the peripheral end portion and the center side of the wafer W. In order to suppress this difference of the airflows as described above, and, also, to suppress mist scattered from the wafer W from splashing back to adhere to the wafer W, the inner peripheral end of the middle cup main body 63 gets thinner and sharper as it goes toward the central axis P, and a top surface thereof forms a horizontal plane in the longitudinal side view. Further, in the present exemplary embodiment, the horizontal plane is located slightly above the top surface of the wafer W. Further, the rest portions of the middle cup main body 63 other than the inner peripheral end pointed as described above are formed as a plate-shaped member having a uniform thickness at the respective portions.

While the inner peripheral end of the middle cup main body 63 is disposed close to the wafer W as described above to regulate the airflow, a peripheral side of the middle cup main body 63 descends toward the peripheral side of the cup 3 to guide the airflow toward the joint exhaust passage 55 below. In addition, as the middle cup main body 63 is curved on the way from the central axis P to the peripheral side of the cup 3, the peripheral side of the middle cup main body 63 has a larger inclination with respect to the horizontal plane, as compared to the central axis P side thereof. The portion located on the central axis P side and having a small inclination is referred to as a lower central inclined portion 63A, and the portion located closer to the peripheral side than the curved portion and having a large inclination is referred to as a lower peripheral inclined portion 63B. Advantages of this configuration in which the middle cup main body 63 has different inclinations on the central axis P side and the peripheral side of the cup 3 will be described later.

Moreover, the curved portion of the middle cup main body 63 is located above the bow-shaped curved portion 53A of the inner cup 51. For this reason, in the longitudinal side view, the lower exhaust passage 60 becomes convex on the way toward the downstream side, and, therefore, the lower exhaust passage 60 is expanded on the downstream side, as compared to the upstream side. Advantages of forming the lower exhaust passage 60 in this way will also be described later.

Next, the upper cup 71 will be described. The upper cup 71 has a vertically extending cylindrical portion 72, and this cylindrical portion 72 is supported on the cylindrical portion 62 of the middle cup 61. An upper edge portion of the cylindrical portion 72 is curved toward the central axis P, forming an upper wall 73 horizontally extending toward the central axis P in a space above the middle cup main body 63. An inner peripheral end portion of this upper wall 73 is curved upwards to form an opening guide portion 74 that rises upwards as it goes toward the central axis P. A circular area surrounded by the opening guide portion 74 is the opening 31 of the cup 3.

Since the opening guide portion 74 has the above-described shape, the diameter of the opening 31 expands as it goes downwards. In addition, forming the opening 31 in this way enables the airflow heading toward the inside of the cup 3 from above to be guided to the peripheral side of the cup 3 to facilitate the introduction of the airflow into an upper exhaust passage 70 to be described later, thus contributing to improving in-surface uniformity of the film thickness of the wafer W.

Now, the sub-edge ring 81 will be explained. The sub-edge ring 81 is provided between the upper cup 71 and the middle cup 61, and includes a sub-edge main body 86 and a support 82 configured to support the sub-edge main body 86 with respect to the upper cup 71. The support 82 extends horizontally from the cylindrical portion 72 of the upper cup 71 toward the central axis P. The support 82 is plural in number, and these supports 82 are arranged at a certain distance therebetween in the circumferential direction of the cup 3. An outer surface of the sub-edge main body 86 is connected to and supported by these supports 82, and gaps between the supports 82 in the circumferential direction of the cup 3 are formed as through holes 85. These through holes 85 form an exhaust passage.

The sub-edge main body 86 is configured as a second annular member extending upwards as it goes toward the central axis P, and is formed along the middle cup main body 63, which is the first annular member. Additionally, as the sub-edge main body 86 becomes thinner as it goes toward the central axis P, an inner peripheral end of this sub-edge main body 86 is pointed so that the processing liquid scattered from the wafer W is suppressed from splashing back to the wafer W.

The sub-edge main body 86 is curved on the way from the peripheral side of the cup 3 toward the central axis P, and a portion of the sub-edge main body 86 on the peripheral side of the cup 3 with respect to this curved portion and a portion on the central axis P side with respect to this curved portion are referred to as an upper peripheral inclined portion 83 and an upper central inclined portion 84, respectively. Each of the upper peripheral inclined portion 83 and the upper central inclined portion 84 is inclined with respect to the horizontal plane and is elongated in a straight line shape in the longitudinal cross sectional view. The inclination of the upper peripheral inclined portion 83 with respect to the horizontal plane is larger than the inclination of the upper central inclined portion 84 with respect to the horizontal plane.

In addition, an inner peripheral end of the sub-edge main body 86 is located slightly on the peripheral side of the cup 3 than the inner peripheral end of the middle cup 61, and is located above the lower central inclined portion 63A of the middle cup 61. In the cup 3 of the first exemplary embodiment, the positions of the inner peripheral end of the sub-edge main body 86 and the inner peripheral end of the upper cup 71 are aligned when viewed from the top.

By providing the sub-edge main body 86 of the sub-edge ring 81 as described above, annular exhaust passages opened toward the central axis P and surrounding the central axis P are respectively formed between the sub-edge main body 86 and the middle cup 61 and between the sub-edge main body 86 and the upper cup 71. The exhaust passage between the sub-edge main body 86 and the middle cup 61 is called a scattered substance collection passage 80, and the exhaust passage between the sub-edge main body 86 and the upper cup 71 is called the upper exhaust passage 70. Accordingly, in the cup 3, the lower exhaust passage 60, the scattered substance collection passage 80, and the upper exhaust passage 70, which are separated from each other, are provided in this sequence as it goes upwards. Further, the sub-edge main body 86, the upper wall 73 of the upper cup 71, and the middle cup main body 63 of the middle cup 61 serve as partition members that partition the inside of the cup 3 to form the passages.

The upper exhaust passage 70 is connected to the joint exhaust passage 55 through the through holes 85 of the sub-edge ring 81 and the through holes 65 of the middle cup 61, and as the joint exhaust passage 55 is evacuated, the lower exhaust passage 60 is evacuated toward the peripheral side of the cup 3. As described above, the lower exhaust passage 60 is also connected to the joint exhaust passage 55, and, besides, the scattered substance collection passage 80 is also connected to the joint exhaust passage 55 as will be described later. That is, there is adopted a configuration in which the lower exhaust passage 60 as a first exhaust passage, the upper exhaust passage 70 as a second exhaust passage, and the scattered substance collection passage 80, which are separated from each other, are evacuated all together by the evacuation of the joint exhaust passage 55 through the exhaust pipe 46.

Figure 4:
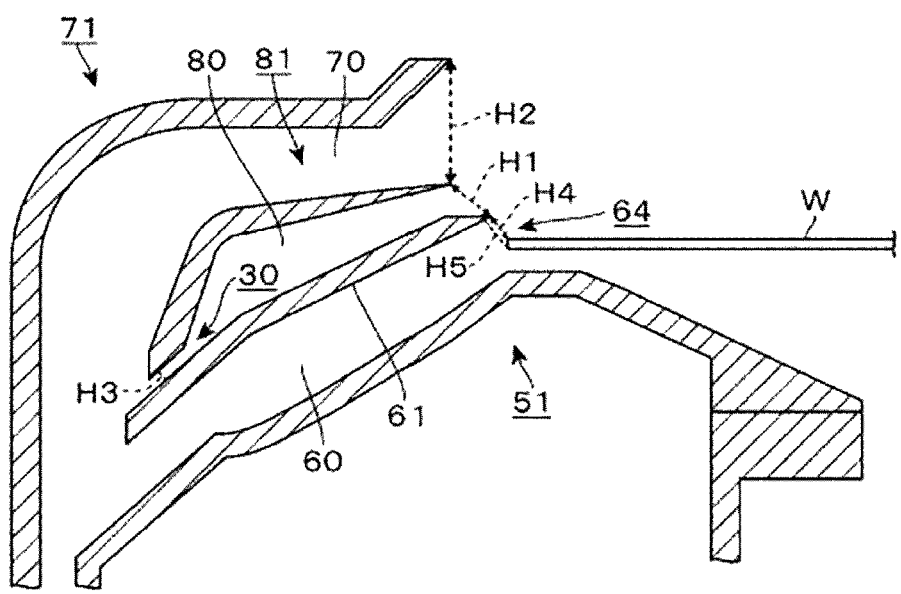
FIG. 4 is a longitudinal side view of the cup.

The sub-edge ring 81 and the scattered substance collection passage 80 will be described in further detail. Reference will be made to FIG. 4 as well, which illustrates an enlarged longitudinal side view of the individual components of the cup 3. The inclinations of the upper peripheral inclined portion 83 and the upper central inclined portion 84 constituting the sub-edge ring 81 with respect to the horizontal plane, and the inclinations of the lower central inclined portion 63A and the lower peripheral inclined portion 63B constituting the middle cup 61 with respect to the horizontal plane are larger in the order of the upper peripheral inclined portion 83, the lower peripheral inclined portion 63B, the lower central inclined portion 63A, and the upper central inclined portion 84 (upper peripheral inclined portion 83>lower peripheral inclined portion 63B>lower central inclined portion 63A>upper central inclined portion 84). As the inclinations of the individual portions are in this relationship, an opening width H1 of the scattered substance collection passage 80 is smaller than an opening width H2 of the upper exhaust passage 70 (H1<H2). This relationship between the opening widths H1 and H2 facilitates flowing of the air into the upper exhaust passage 70, which may contribute to improving the in-surface uniformity of the film thickness of the wafer W as will be described later.

A bottom surface of an outer peripheral portion of the sub-edge main body 86 of the sub-edge ring 81 is close to and faces a top surface of the lower peripheral inclined portion 63B of the middle cup 61. An annular gap formed between the bottom surface of the outer peripheral portion of the sub-edge main body 86 and the top surface of the lower peripheral inclined portion 63B, which are adjacent to each other, is called a communication hole 30. This communication hole 30 is an exhaust passage that is connected to the aforementioned scattered substance collection passage 80 and provided downstream of the scattered substance collection passage 80. The scattered substance collection passage 80 is connected to the joint exhaust passage 55 through the communication hole 30 and the through holes 65 of the middle cup 61, and the scattered substance collection passage 80 is evacuated toward the peripheral side of the cup 3 by the evacuation of the joint exhaust passage 55. A width H3 of the communication hole 30 is set to be smaller than the opening width H1 of the scattered substance collection passage 80. Accordingly, a flow passage ranging from the opening of the scattered substance collection passage 80 to the joint exhaust passage 55 is configured to be narrowed on the way (narrowed on the downstream side).

In order to explain the advantages of providing the scattered substance collection passage 80 and the sub-edge ring 81, a cup having the same configuration as the cup 3 except that the sub-edge ring 81 is not provided will be explained as a comparative example. When a film is formed by spin coating, a film thickness at the peripheral end portion the wafer W tends to be larger than a film thickness at a portion other than the peripheral end portion. Thus, if a film is formed on the wafer W by using the cup of the comparative example, the discrepancy between the film thickness at the peripheral end portion and the film thickness at the portion other than the peripheral end portion may become relatively large.

It is known that, when forming a film by spin coating, the higher the flow velocity of the airflow around the peripheral end portion of the wafer W, the larger the film thickness tends to be. When the flow velocity of the airflow in the cup is investigated after a simulation for the cup of the comparative example is performed, it is found out that the flow velocity of the airflow around the peripheral end portion of the wafer W, that is, the flow velocity in and around the above-described gap 64 is relatively large. In addition, it is also found out that the flow velocity in the lower exhaust passage 60 leading to the gap 64 is also large.

As described above, since the middle cup 61 is formed close to the wafer W, the gap 64 is relatively small, and a pressure loss of the air in this gap 64 is relatively large. For this reason, in the cup of the comparative example, the air sucked from the opening 31 of the cup mainly flows into a flow passage (for conveniences' sake, referred to as flow passage A) between the upper cup 71 and the middle cup 61. However, since the distance between the flow passage A and the gap 64 is relatively short, a relatively large amount of the air heading toward the flow passage A is sucked in from the gap 64 to be introduced into the gap 64 and the lower exhaust passage 60, so that the flow velocity in each of these places increases.

It may be considered to suppress the flow velocity of the airflow at the peripheral end portion of the wafer W by setting an exhaust amount in the cup to be small. In such a case, however, performance of removing mist generated from the wafer W is reduced, and the mist may adhere to the wafer W as a foreign matter. Besides, it may also be considered to increase the thickness of the middle cup 61 to make the distance between the flow passage A and the gap 64 relatively large. In that case, however, the processing liquid (including that in a mist state) scattered from the wafer W may easily splash back after colliding with the middle cup 61. Due to this splash, there is a concern that the foreign matter generated from the mist may remain on the surface of the wafer W after being subjected to the processing.

To solve the problem, there is adopted a configuration in which the sub-edge ring 81 is provided in the cup 3 to divide the space between the upper cup 71 and the middle cup 61, and the scattered substance collection passage 80 separated from the lower exhaust passage 60 and the upper exhaust passage 70 is provided between the lower exhaust passage 60 and the upper exhaust passage 70 formed by the upper cup 71 and the middle cup 61. As will be explained in detail later, this scattered substance collection passage 80 is configured such that the inflow of the air introduced from the opening 31 of the cup 3 into the scattered substance collection passage 80 is inhibited. Therefore, when viewed from the air flowing into the cup 3, it seems as if a relatively thick wall exists between the upper exhaust passage 70 and the gap 64. Thus, when viewed from the air heading toward the upper exhaust passage 70 from the opening 31 of the cup 3, since the distance between the upper exhaust passage 70 and the gap 64 is relatively large, it is difficult for the air to be sucked into the gap 64. As a result, the air flowing to the gap 64 and the lower exhaust passage 60 is reduced, so the flow velocity of the airflow at the peripheral end portion of the wafer W is suppressed. That is, the airflow around the substrate is adjusted. As a result, the film thickness of the resist film at the peripheral end portion of the wafer W becomes relatively small, so that the deviation from the film thicknesses of the resist film at the portions other than the peripheral end portion is reduced. As a consequence, the resist film having high the in-surface uniformity is formed on the wafer W.

Since the scattered substance collection passage 80 is a space, the processing liquid scattered from the wafer W may enter this scattered substance collection passage 80. Since the scattered substance collection passage 80 is connected to the joint exhaust passage 55 through the communication hole 30, the processing liquid supplied into the scattered substance collection passage 80 flows into the joint exhaust passage 55 to be removed. That is, in the configuration of the cup 3 in which the scattered substance collection passage 80 is provided, the processing liquid scattered from the wafer W is suppressed from splashing back to the wafer W, unlike in the above-described configuration in which the middle cup 61 is thickened.

However, even in the configuration in which the scattered substance collection passage 80 is formed by the sub-edge ring 81, if a large amount of air is introduced into this scattered substance collection passage 80 from the opening 31 of the cup 3, the amount of the air flowing into the gap 64 increases, the same as in the cup of the comparative example. In such a case, the flow velocity of the airflow at the peripheral end portion of the wafer W also increases. The sub-edge ring 81 is configured to suppress such an inflow of a large amount of air into the scattered substance collection passage 80. Specifically, a pressure loss in the communication hole 30 formed by the sub-edge ring 81 and the middle cup 61 is larger than the aforementioned pressure loss in the gap 64. Accordingly, it is difficult for the air to pass through the communication hole 30, and, therefore, it is also difficult for the air to flow into the scattered substance collection passage 80 located upstream of the communication hole 30.

As for the reason why the pressure loss in the communication hole 30 is larger than the pressure loss in the gap 64, a case where the opening area of the gap 64 is smaller than the opening area of the communication hole 30 may be considered as well as a case where the pressure loss in the communication hole 30 is literally larger than the pressure loss in the gap 64. In determining whether the opening area of the gap 64 is smaller than the opening area of the communication hole 30, a supplementary explanation will be given regarding the opening area of the gap 64 in comparing it with the opening area of the communication hole 30. As for the wafer W that is transferred to the resist film forming apparatus 1 and processed thereby, since the type and the thickness of the film formed on the wafer are arbitrary, the size of the gap 64 may vary depending on the wafer W placed on the spin chuck 11.

However, when calculating the opening area of the gap 64 for the comparison with the opening area of the communication hole 30, it is assumed that the wafer W without having a film formed thereon and having a size as designed is placed at a set position on the spin chuck 11. That is, it is assumed that the center of the wafer W lies on the central axis P. The opening area of the gap 64 is calculated from a distance H4 (see FIG. 4) between an outer peripheral end of the top surface of the wafer W placed in this way and an inner peripheral end of the middle cup 61, and a length of the gap 64 in the circumferential direction of the cup 3.

Additionally, the opening area of the communication hole 30 in comparing it with the opening area of the gap 64 will be explained. The opening area of the communication hole 30 may vary depending on a position in the direction of the flow passage. Here, the opening area of the communication hole 30 is regarded as the opening area at a position where the opening area is the smallest (a position where the pressure loss increases). Specifically, in the present exemplary embodiment, the communication hole 30 is an annular hole, and the width of the communication hole 30 is uniform as H3 in the direction of the flow passage of the communication hole 30. Since, however, this communication hole 30 is formed obliquely downwards in the longitudinal side view, the length of the communication hole 30 in the circumferential direction increases as it goes from an upstream end toward a downstream end thereof. Therefore, although the opening area of the communication hole 30 differs on the upstream side and the downstream side of the communication hole 30, the opening area at the position where it is smallest is regarded as the opening area of the communication hole 30. Thus, the opening area of the communication hole 30 is the opening area calculated from the length of the upstream end of the communication hole 30 in the circumferential direction and the width H3 thereof, and the opening area thus calculated is compared with the opening area of the gap 64. Further, the width H3 of the communication hole 30 at all positions in the circumferential direction may be set to be always smaller than the distance H4 at all positions in the circumferential direction.

Additionally, the opening area of the communication hole 30 will be further explained. The communication hole 30 may be divided into a plurality of parts in the circumferential direction of the cup 3, for example. In such a case, the sum of the opening areas of the respective divided parts of the communication hole is taken as the opening area of the communication hole 30. Additionally, the communication hole 30 may be configured such that its width changes in the direction of the flow passage. In such a case, when calculating the opening area of each part in the direction of the flow passage from the width of the communication hole 30 and the length thereof in the circumferential direction, the smallest opening area is taken as the opening area of the communication hole 30 and is compared with the opening area of the gap 64.

In addition, in the present exemplary embodiment, the communication hole 30 and the scattered substance collection passage 80 are separated by a step formed therebetween. Alternatively, however, there may be adopted a configuration in which the scattered substance collection passage 80 and the communication hole 30 are not separated. As a specific example, the thicknesses of the upper peripheral inclined portion 83 and the upper central inclined portion 84 forming the sub-edge ring 81 change as they go from the central axis P side toward the peripheral side of the cup 3. Due to such a change in thickness, the scattered substance collection passage 80 and the communication hole 30 are not separated from each other, and become a gradually narrowing flow passage as it goes toward a downstream end. In the case of such a stepless flow passage, the smallest opening area of this stepless flow passage in the direction of the flow passage is taken as the opening area of the communication hole 30, and is compared with the opening area of the gap 64. If the opening area at the downstream end is the smallest in the configuration in which the stepless flow passage gest gradually narrower, the opening area at the downstream end is compared with the opening area of the gap 64. In addition, in the case where the communication hole 30 and the scattered substance collection passage 80 are configured as the stepless flow passage as stated above, the portion where the opening area is the smallest (that is, the narrowest portion) corresponds to the communication hole, and the portion upstream of the portion where the opening area is the smallest corresponds to the scattered substance collection passage.

In addition, even in case of directly comparing the pressure loss between the gap 64 and the communication hole 30, rather than comparing the pressure loss through the comparison of the opening area, it is assumed that the pressure loss in the gap 64 is a pressure loss when the wafer W having no film formed thereon is placed at a set position. Additionally, if the communication hole 30 is divided in the circumferential direction of the cup 3, the total pressure loss in the communication hole 30 and the pressure loss in the gap 64 are compared, the same as in the comparison of the opening areas.

In addition, regarding the comparison of the pressure loss itself, the pressure loss in the gap 64 and the pressure loss in the communication hole 30 are calculated and compared. Regarding the pressure loss in the gap 64 in that case, it may be assumed that an upper end and a lower end of the peripheral end of the wafer W respectively form the upstream end and the downstream end of the gap 64 as the flow passage. Specifically, H5 in FIG. 4 is a straight line connecting a peripheral end of the bottom surface of the wafer W and the inner peripheral end of the middle cup 61, and is drawn in parallel with an arrow of a straight line connecting the middle cup 61 and the wafer W to indicate the aforementioned distance H4 between the inner peripheral end of the middle cup 61 and the peripheral end of the top surface of the wafer W. The region surrounded by the arrow indicating the distance H4 and the line H5 is defined as the gap 64, and the arrow indicates the upstream end of the gap 64, while the line H5 indicates the downstream end of the gap 64. The pressure loss in this gap 64 is calculated and compared with the pressure loss in the communication hole 30.

Figure 5:
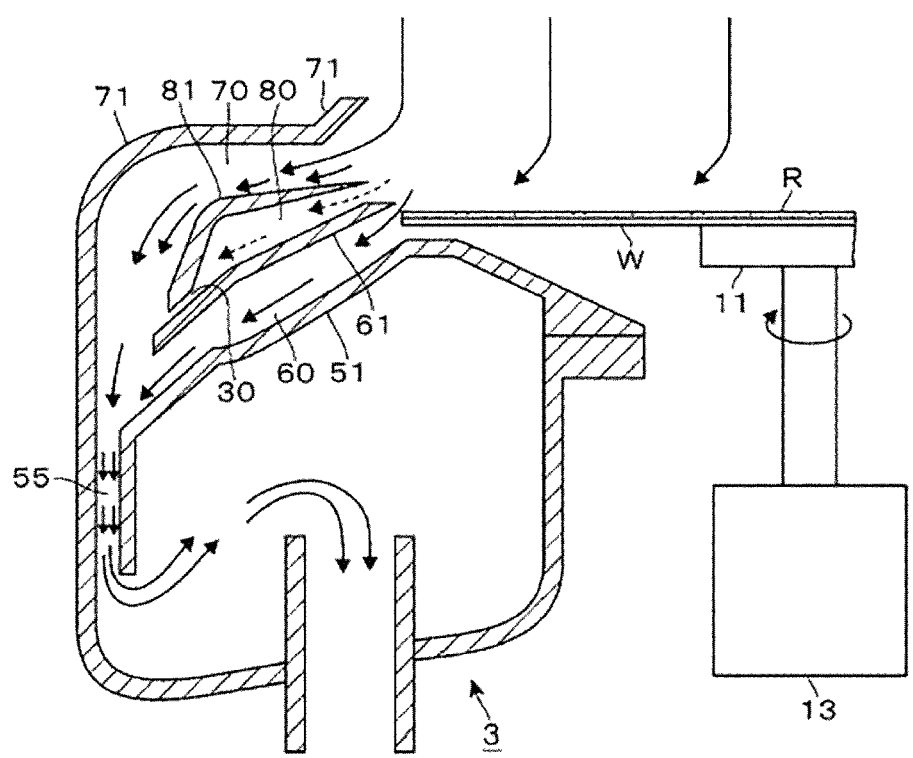
FIG. 5 is a longitudinal side view illustrating flows of air in the cup.

A processing of the wafer W by the resist film forming apparatus 1 described above will be discussed with reference to FIG. 5. FIG. 5 is a longitudinal side view of the cup 3, schematically illustrating flows of the air during the processing of the wafer W with arrows. These arrows are of different line types according to the magnitude of the flow velocity of the airflow. As for the relationship regarding the magnitude of the flow velocity between the line types, a solid-line arrow indicates a larger flow velocity than a dotted-line arrow (solid-line arrow>dotted-line arrow). Additionally, the arrows are densely drawn at a place where a large amount of air flows.

First, the wafer W is transferred by a non-illustrated transfer mechanism to the cup 3 evacuated through the exhaust pipe 46, and placed on the spin chuck 11 via the lift pins 16. The thinner is discharged onto the central portion of the wafer W, and as the wafer W is rotated, the thinner is spread onto the entire surface of the wafer W by a centrifugal force to be coated thereon. Subsequently, the resist is discharged onto the central portion of the wafer W, and as the wafer W is rotated, the resist is spread onto the entire surface of the wafer W by a centrifugal force to be coated thereon, thus forming a resist film R.

While the wafer W is being processed by the processing liquid (the resist or the thinner) in this way, the evacuation of the cup 3 is carried on. Most of the air heading toward the cup 3 from above is introduced into the upper exhaust passage 70, which is formed in the uppermost part of the cup 3 and suffers the smallest pressure loss among the upper exhaust passage 70, the lower exhaust passage 60, and the scattered substance collection passage 80, and then, is exhausted. As described above, the scattered substance collection passage 80 having the relatively high pressure loss is disposed between the opening of the upper exhaust passage 70 and the gap 64 formed by the wafer W and the middle cup 61 to serve as an inlet of the lower exhaust passage 60. For this reason, the air heading toward the upper exhaust passage 70 is less likely to be influenced by suctioning through the gap 64 and the lower exhaust passage 60. As a result, the amount of the air heading toward the gap 64, that is, the peripheral end portion of the wafer W is suppressed, so that the flow velocity of the airflow at this peripheral end portion becomes relatively small. In addition, due to the differences in the pressure loss between the respective parts as described above, the magnitude of the flow velocity of the air in the scattered substance collection passage 80 is smaller than those of the upper exhaust passage 70 and the lower exhaust passage 60 as illustrated in the drawings.

The processing liquid scattered from the wafer W during the processing is introduced into the upper exhaust passage 70, the lower exhaust passage 60, and the scattered substance collection passage 80. Since the evacuation is performed in each of these flow passages, the introduced processing liquid is directed to the downstream side of each of these flow passages (toward the peripheral side of the cup 3) and flows down to the bottom wall 43 of the cup 3 via the joint exhaust passage 55 to be removed from the drain port 45. After the above-described resist film is formed, the rotation of the wafer W is stopped, and the wafer W is transferred to the transfer mechanism via the lift pins 16 and carried out from the resist film forming apparatus 1.

As described above, in the resist film forming apparatus 1, with regard to the airflow formed in the cup 3, the flow velocity of this airflow around the peripheral end portion of the wafer W is suppressed. For this reason, in the resist film R formed on the surface of the wafer W, the difference between the film thickness at the peripheral end portion and the film thickness at the other portions is suppressed, so that the resist film R is formed on the surface of the wafer W with high in-surface uniformity. That is, a processing state within the surface of the wafer W may be obtained as required.

Meanwhile, the upper exhaust passage 70 formed by the sub-edge main body 86 draws the air to the peripheral side of the cup 3, thereby suppressing the air from being introduced into the gap 64 below as described above. If the inclination of the opening direction of the upper exhaust passage 70 with respect to the horizontal plane is relatively large, the air introduced into the cup 3 may receive a strong downward force, raising a risk that the amount of the air flown into the gap 64 may increase. That is, it is desirable that the upper exhaust passage 70 is opened at an angle that is horizontal or close to horizontal. In addition, it is desirable to set the pressure loss in the communication hole 30 formed between the peripheral end portion of the sub-edge main body 86 and the top surface of the middle cup 61 to be relatively large by allowing the peripheral end portion of the sub-edge main body 86 to be close to the top surface of the middle cup 61 as described above. The sub-edge main body 86 is provided with the curved portion in the radial direction as described above, and is configured such that it has a smaller inclination with respect to the horizontal plane on the central axis P side than on the peripheral side. With this configuration, the inclination of the upper exhaust passage 70 is made relatively small, and the peripheral end portion of the sub-edge main body 86 is formed close to the middle cup 61, so that the pressure loss in the communication hole 30 is made relatively large. Therefore, this configuration contributes to suppressing the flow velocity of the airflow around the peripheral end portion of the wafer W.

Modification Examples

Hereinafter, various modification examples of the cup 3 will be described with reference to longitudinal sides views of FIG. 6 to FIG. 9, focusing on differences from the cup 3 described so far. In the example shown in FIG. 6, the cup 3 is equipped with a sub-edge main body 87 having a different configuration from the above-described sub-edge main body 86. The sub-edge main body 87 forms, in a longitudinal cross sectional view, a circular arc, and the sub-edge main body 87 at a side of the sidewall 39 of the cup 3 is located below the sub-edge main body 87 at a side of the central axis P, the same as in the sub-edge main body 86. Further, the curvature of the circular arc in the radial direction of the sub-edge main body 87 is constant. In comparison, the curvature of the sub-edge main body 86 in the radial direction varies as it is curved as described above, and a portion (curved portion) with a large curvature is interposed between portions (straight portions) with a small curvature in the radial direction.

Figure 6:
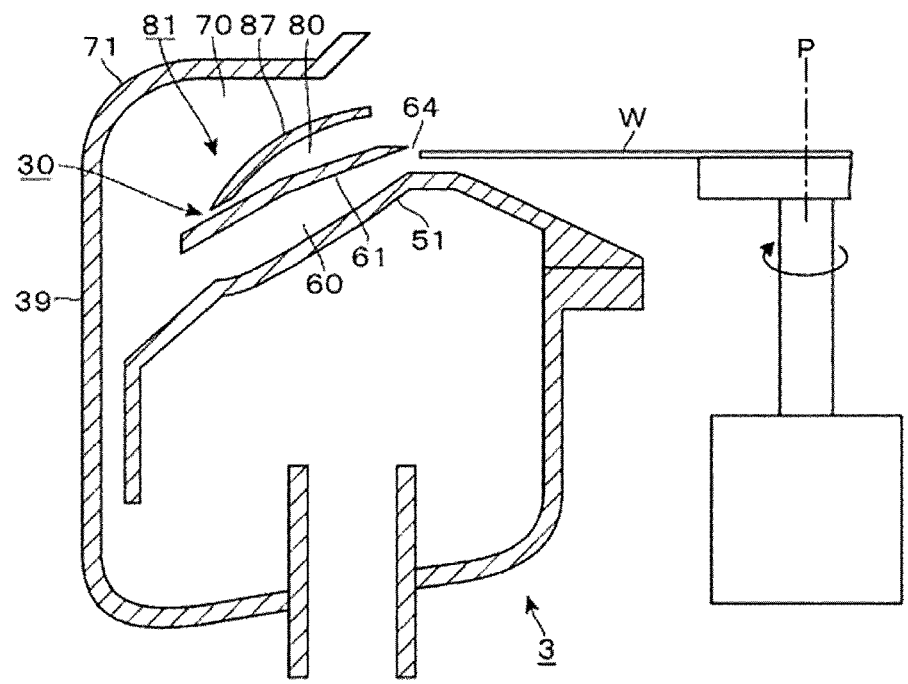
FIG. 6 is a longitudinal side view illustrating a modification example of the cup.

With this configuration of the sub-edge main body 87 of FIG. 6 as well, by suppressing the inclination of the opening of the upper exhaust passage 70 as in the sub-edge main body 86 described in FIG. 1, etc., and by disposing the peripheral end portion thereof close to the top surface of the middle cup 61, the pressure loss in the communication hole 30 can be made relatively large. However, as can be apparently seen from the comparison of FIG. 1 and FIG. 6, the width of the opening of the upper exhaust passage 70 in the case of using the sub-edge main body 86 can be made larger than that in the case of using the sub-edge main body 87. Therefore, in the case of using the sub-edge main body 86, the amount of the air sucked in through the upper exhaust passage 70 can be increased, so that the flow velocity of the airflow at the peripheral end portion can be more reliably suppressed. Thus, it is desirable to adopt a configuration with different curvatures in the radial direction, the same as in the sub-edge main body 86.

Figure 7:
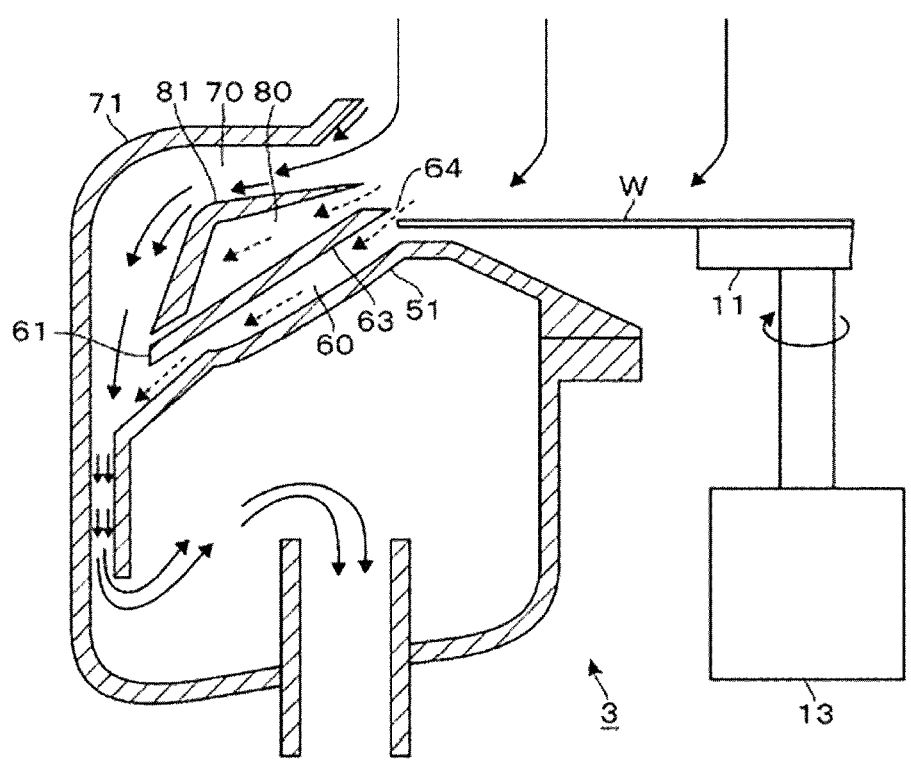
FIG. 7 is a longitudinal side view illustrating another modification example of the cup.

Other modification examples of the cup 3 will be described with reference to FIG. 7 and FIG. 8. In FIG. 7, arrows of different line types schematically indicate magnitudes of the flow velocity of the airflow, the same as in FIG. 5. In the examples shown in FIG. 7 and FIG. 8, no curved portion is formed at the middle cup main body 63, unlike in the configuration described in FIG. 1, etc., and the middle cup main body 63 has a straight line shape in the longitudinal cross sectional view. That is, the middle cup main body 63 in FIG. 7 and FIG. 8 does not have the lower central inclined portion 63A and the lower peripheral inclined portion 63B with different inclinations described in FIG. 1. In addition, in the examples shown in FIG. 7 and FIG. 8, the size of the gap 64 between the wafer W and the middle cup 61 is equal to the size of the gap 64 in the example described in FIG. 1, etc. The middle cup main body 63 may have the configurations as shown in FIG. 7 and FIG. 8.

Meanwhile, in the example shown in FIG. 7, since the curved portion of the middle cup main body 63 is not formed, the inclination of the middle cup main body 63 on the central axis P side is sharp, as compared to the configuration example shown in FIG. 1. Therefore, the width of the lower exhaust passage 60 becomes narrower than that in the configuration example shown in FIG. 1, making it difficult for the air to flow through the lower exhaust passage 60. As a result, there is a risk that the film thickness distribution of the wafer W in the surface thereof may be adversely affected.

Figure 8:
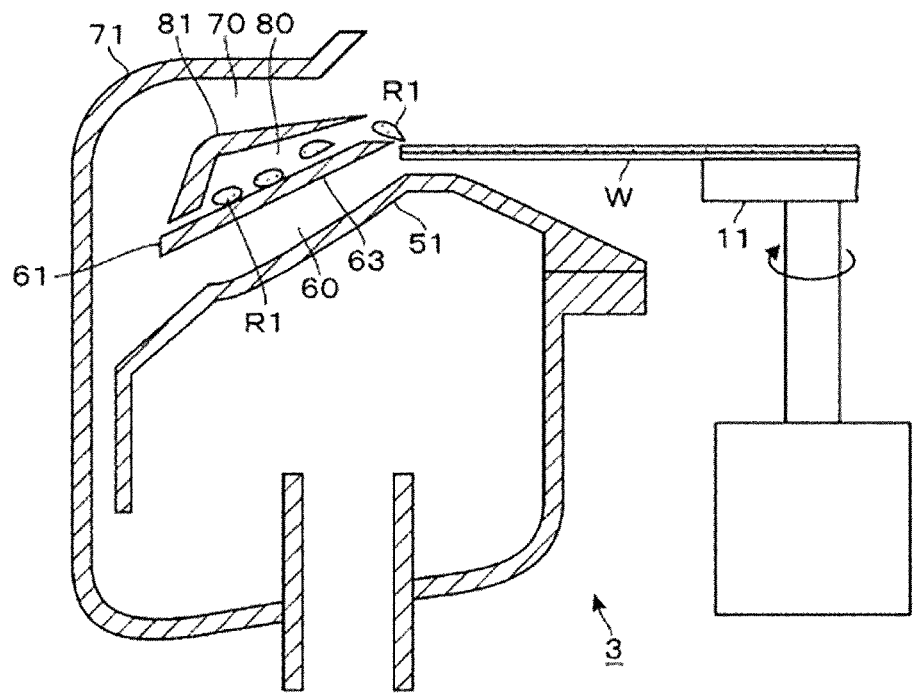
FIG. 8 is a longitudinal side view illustrating yet another modification example of the cup.

In the configuration example of FIG. 8, in order to suppress the width of the lower exhaust passage 60 from being narrowed, the inclination of the middle cup main body 63 on the peripheral side is made gentle as compared to the configuration example shown in FIG. 1, etc. However, in such a configuration in which the inclination is gentle, it is difficult for a droplet R1 of the processing liquid scattered from the wafer W into the scattered substance collection passage 80 and adhering to an upper wall surface of the middle cup main body 63 to flow down along the upper wall surface, so that the processing liquid may be gathered in the scattered substance collection passage 80. If the processing liquid scattered from the wafer W collides with this liquid pool of the processing liquid, there is a risk that the processing liquid may splash toward the wafer W and adhere thereto as a foreign matter.

Therefore, in order to suppress the stay of the airflow in the lower exhaust passage 60 and the adhesion of the foreign matter due to the splash of the processing liquid, it is desirable that the middle cup main body 63 has the lower central inclined portion 63A and the lower peripheral inclined portion 63B having different inclinations, as illustrated in FIG. 1. Further, the middle cup main body 63, which is disposed close to the peripheral end portion of the wafer W as described above, has a function of suppressing a change of the airflow at the peripheral end portion of the wafer W. In setting the inclinations of the lower central inclined portion 63A and the lower peripheral inclined portion 63B to be different, the inclination of the lower central inclined portion 63A with respect to the horizontal plane is set to be smaller.

Figure 9:
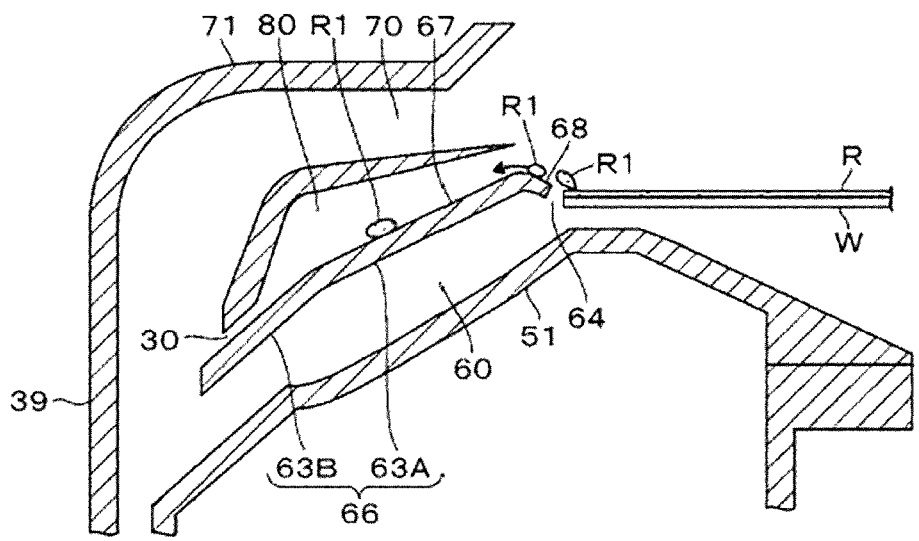
FIG. 9 is a longitudinal side view illustrating still yet another modification example of the cup.

FIG. 9 presents an additional modification example of the middle cup main body. Like the above-described middle cup main body 63, a middle cup main body 66 shown in FIG. 9 has the lower central inclined portion 63A and the lower peripheral inclined portion 63B having different inclinations. However, an inner peripheral side of the lower central inclined portion 63A extends to a position above the top surface of the wafer W placed on the spin chuck 11 as it goes toward the central axis P, and then descends from this position above the top surface of the wafer W as it goes further toward the central axis P. Additionally, the inner peripheral end of the middle cup main body 66 is disposed close to the wafer W, the same as the inner peripheral end of the middle cup main body 63 described in FIG. 1, etc., so that the gap 64 is formed therebetween. As the peripheral end portion of the middle cup main body 66 is curved as described above, the top surface of the lower central inclined portion 63A forming the middle cup main body 66 is provided with an inclined surface 67 and an inclined surface 68 formed on the central axis P side to be continuous with the inclined surface 67. The inclined surface 67 rises whereas the inclined surface 68 descends as they go toward the central axis P side.

When the droplet or the mist of the processing liquid scattered from the wafer W collide with the inclined surface 68, the droplet or the mist is forced up the inclined surface 68 onto the inclined surface 67, and flows down toward the peripheral side of the cup 3 or is removed by being swept away by the airflow on the inclined surface 68. That is, the inclined surface 68 formed at the inner peripheral end portion of the middle cup main body 66 serves to guide the scattered substance from the wafer W to the downstream side of the scattered substance collection passage 80, thus facilitating the removal of the scattered substance from the vicinity of the wafer W. As the removal of the scattered substance is facilitated in this way, the scattered substance is suppressed from adhering to the wafer W as the foreign matter, so that a decrease in the yield of semiconductor products manufactured from the wafer W can be avoided.

However, in each of the examples described so far, the lower exhaust passage 60 formed by the middle cup 61 and the inner cup 51 is configured to be convex on the way toward the downstream side. More specifically, the lower exhaust passage 60 is configured to be wider on the downstream side than on the upstream side when viewed from the side. With such a configuration in which the width is enlarged, the pressure loss in the lower exhaust passage 60 is relatively small. Therefore, the airflow is suppressed from staying around the wafer W, and the adhesion of the mist as the foreign matter to the peripheral end portion of the wafer W is more securely suppressed.

In addition, if the pressure loss in the lower exhaust passage 60 is too small, there is a risk that the flow velocity of the airflow flowing near the peripheral end portion of the wafer W may increase. Thus, the pressure loss in the lower exhaust passage 60 needs to be small within a range in which an appropriate flow velocity is obtained near the peripheral end portion of the wafer W. As each of the middle cup 61 and the inner cup 51 has the curved portion, the above-described convex portion is formed, increasing the width of the lower exhaust passage 60. Alternatively, there may be adopted a configuration in which the curved portion is formed at either one of the middle cup 61 and the inner cup 51 such that the lower exhaust passage 60 is made convex with its downstream side wider than the upstream side thereof.

Second Exemplary Embodiment

Figure 10:
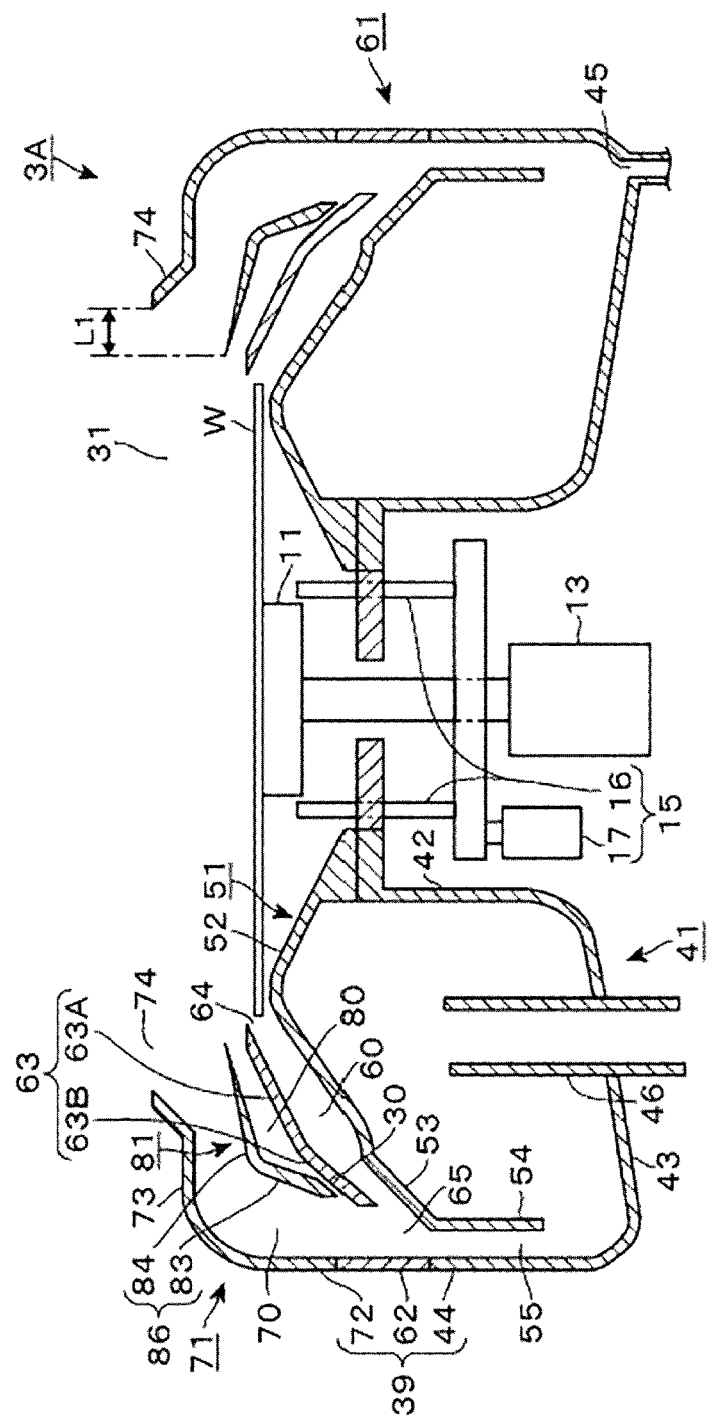
FIG. 10 is a longitudinal side view illustrating a cup according to a second exemplary embodiment.

FIG. 10 is a longitudinal side view of a second cup 3A. The second cup 3A is different from the cup 3 of the first exemplary embodiment in that, in the cup 3A, the inner periphery of the opening guide portion 74 of the upper cup 71 is located closer to the peripheral side of the cup 3 than the inner periphery of the sub-edge ring 81 is. Therefore, in the cup 3A, the diameter of the opening 31 is larger than that of the cup 3. With this configuration, some of the air heading into the cup 3A from above the cup 3A is introduced into the upper exhaust passage 70 after colliding with the inner peripheral end portion of the sub-edge ring 81 and suffering a reduction in a downward momentum.

Thus, the cup 3A is configured such that more air is introduced into the upper exhaust passage 70 than in the cup 3. Assuming that an exhaust flow rate of the cup 3A is constant, the larger the amount of the air introduced into the upper exhaust passage 70 is, the smaller the amount of the air introduced into the gap 64, that is, to the peripheral end portion of the wafer W may be. For this reason, in the cup 3A, the flow velocity of the air at the peripheral end portion of the wafer W can be suppressed as compared to the cup 3, and, accordingly, the deviation between the film thickness of the resist film R at this peripheral end portion and the film thickness at other portions can be suppressed more reliably. Additionally, if the diameter of the opening 31 becomes too large, there is a risk that the mist may be scattered to the outside of the cup 3. To suppress this, in the example of FIG. 10, a distance L1 between the inner periphery of the opening guide portion 74 forming the opening 31 and the inner periphery of the sub-edge ring 81 in the horizontal direction is, for example, 10 mm or less, in the longitudinal side view.

Although the thinner and the resist are described as an example of the processing liquids used in a coating film forming apparatus, the processing liquids are not limited thereto. For example, various processing liquids for coating film formation, such as a chemical liquid for forming an insulating film and a chemical liquid for forming an antireflection film, may be used. In addition, the technique of the present disclosure is not limited to being applied to the apparatus using the processing liquid for coating film formation, and may also be applied to an apparatus configured to supply a developer or a cleaning liquid to the wafer W to perform a required processing, an apparatus configured to supply an adhesive to a plurality of wafers W to bond the wafers W, and so forth. Therefore, the liquid processing apparatus is not limited to the coating film forming apparatus.

Further, the substrate as a processing target is not limited to the wafer W, and may be, for example, a substrate for the manufacture of a flat panel display. Therefore, it is possible to process an angled substrate. Additionally, the technique of the present disclosure may be applied to a liquid processing apparatus that is not provided in the atmospheric atmosphere but provided in a gas atmosphere other than the air, such as an inert gas atmosphere.

Here, it should be noted that the above-described exemplary embodiments are illustrative in all aspects and are not anyway limiting. The above-described exemplary embodiments may be omitted, replaced and modified in various ways without departing from the scope and the spirit of claims.

[Evaluation Test]

Now, an evaluation test performed for the resist film forming apparatus 1 will be described. In an evaluation test, a resist film is formed on the wafer W by using the resist film forming apparatus 1 equipped with different cups. Then, film thicknesses at positions on the wafer W spaced apart from each other along the diameter of the wafer W are measured. This resist film forming apparatus 1 is equipped with, as a cup, any one of the cup of the comparative example, the cup 3, and the cup 3A.

Figure 11:
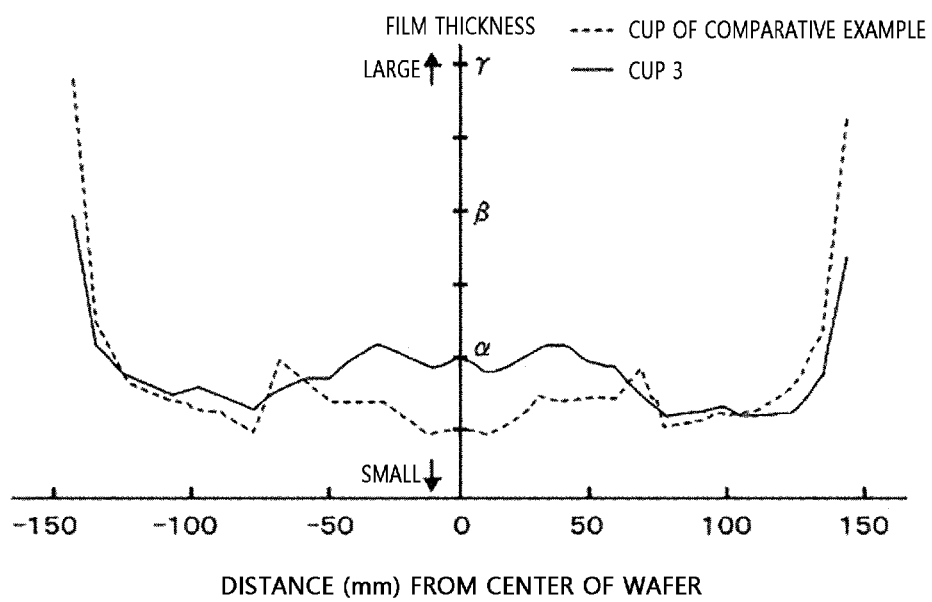
FIG. 11 presents graphs showing a result of an evaluation test.
Figure 12:
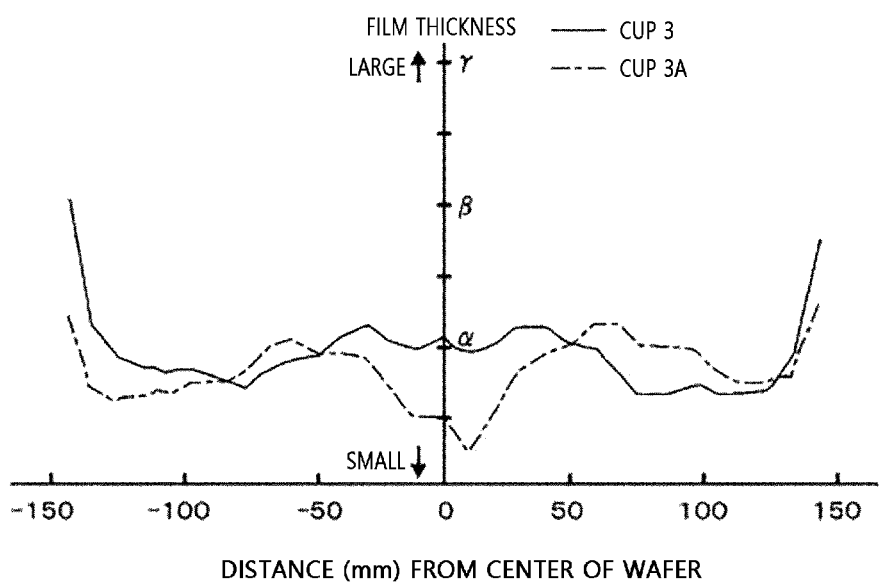
FIG. 12 provides graphs showing a result of an evaluation test.

Graphs of FIG. 11 and FIG. 12 show the results of this evaluation test. FIG. 11 presents measurement data obtained from the cup of the comparative example and the cup 3, and FIG. 12 presents measurement data obtained from the cup 3 and the cup 3A. A horizontal axis of each graph represents a distance from the center of the wafer W. A vertical axis of each graph represents a film thickness, and gradations are given at a regular interval. In FIG. 11 and FIG. 12, the size of the film thickness between the respective gradations is the same. In addition, in FIG. 11 and FIG. 12, α, β, and γ are assigned to gradations indicating specific values of the film thickness. Between FIG. 11 and FIG. 12, there is no difference in the values of α, β, and γ.

In comparison of the data obtained by using the cup of the comparative example and the data obtained by using the cup 3 shown in FIG. 11, in both of the case of using the cup of the comparative example and the case of using the cup 3, there is found no significant variation in the film thickness at respective portions other than the peripheral end portion of the wafer W. The film thickness at the peripheral end portion of the wafer W is larger than the film thicknesses at the other portions in both of the case of using the cup of the comparative example and the case of using the cup 3. However, in the cup 3, the deviation between the film thickness at the peripheral end portion and the film thicknesses at the other portions is suppressed, as compared to the cup of the comparative example.

From each of the data obtained by using the cup of the comparative example and the data obtained by using the cup 3, a difference between the film thickness obtained from a first measurement position on the most peripheral end side of the wafer W and the film thickness obtained from a second measurement position next to the first measurement position at a distance of 10 mm therebetween are calculated. Hereinafter, this difference will be referred to as a peripheral end film thickness difference. Then, a value of a peripheral end film thickness difference in the data of the cup 3/a peripheral end film thickness difference in the data of the cup of the comparative example×100 (unit: %) is found to 44.7%. As can be seen from this, it is found that an increase of the film thickness at the peripheral end of the wafer W is greatly suppressed in the cup 3, as compared to the cup of the comparative example.

Now, in comparison of the data obtained by using the cup 3 and the data obtained by using the cup 3A with reference to FIG. 12, in both of the case of using the cup 3 and the case of using the cup 3A, there is found no significant variation in the film thickness at respective portions other than the peripheral end portion of the wafer W. The film thickness at the peripheral end portion of the wafer W is larger than the film thicknesses at the other portions in both of the case of using the cup 3 and the case of using the cup 3A. However, in the cup 3A, the deviation between the film thickness at the peripheral end portion and the film thicknesses at the other portions is suppressed. A value of a peripheral end film thickness difference of the cup 3A/a peripheral end film thickness difference of the cup 3×100 (unit: %) is calculated to be 41.7%. As can be seen from this, it is proved that an increase of the film thickness at the peripheral end of the wafer W is further suppressed in the cup 3A.

According to the exemplary embodiment, it is possible to adjust the airflow around the substrate as the target of the liquid processing to thereby achieve the required processing state.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

We claim:

1. A cup, surrounding a substrate which is disposed in a placing unit and to which a processing liquid is supplied, configured to be evacuated, the cup comprising:

a flow passage forming member forming, on a peripheral side of the cup with respect to the substrate within the cup, a first exhaust passage, a scattered substance collection passage configured to collect a scattered substance from the substrate, and a second exhaust passage, which are separated from each other, in sequence as going upwards, each of the first exhaust passage, the scattered substance collection passage and the second exhaust passage being an annular passage opened toward a central axis side of the cup;

a joint exhaust passage connected to each of the first exhaust passage, the scattered substance collection passage, and the second exhaust passage such that the first exhaust passage, the scattered substance collection passage, and the second exhaust passage are evacuated simultaneously toward the peripheral side of the cup, the joint exhaust passage being disposed below the substrate within the cup;
a first annular member included in the flow passage forming member, and formed along an outer periphery of the substrate, the scattered substance collection passage and the first exhaust passage being formed above and below the first annular member, respectively; and
a communication hole provided in the flow passage forming member to allow the scattered substance collection passage and the joint exhaust passage to communicate with each other such that a pressure loss of the communication hole is large as compared to a pressure loss in a gap formed between the first annular member and the substrate.

2. The cup of claim 1,
wherein the flow passage forming member comprises:
an upper wall extending, in a space above the first annular member, toward a central axis of the cup from a side wall of the cup to form an opening of the cup; and
a second annular member disposed above the first annular member, the scattered substance collection passage and the second exhaust passage being formed between the second annular member and the first annular member and between the second annular member and the upper wall, respectively.

3. The cup of claim 2,
wherein an inner peripheral end of the upper wall is located closer to the peripheral side of the cup than an inner peripheral end of the second annular member is.

4. The cup of claim 1,
wherein the first annular member extends upwards as going toward a central axis of the cup, and
an inclination of the first annular member with respect to a horizontal plane is smaller on the central axis side of the cup than on the peripheral side of the cup.

5. The cup of claim 4,
wherein an inner peripheral end portion of the first annular member extends downwards from above the substrate as going toward the central axis of the cup.

6. The cup of claim 1,
wherein a width of a downstream side of the first exhaust passage is larger than a width of an upstream side of the first exhaust passage, when viewed from a side.

7. A liquid processing apparatus, comprising:
a placing unit configured to place a substrate therein;
a cup disposed around the substrate placed in the placing unit, and configured to be evacuated;
a processing liquid supply mechanism configured to supply a processing liquid to the substrate placed in the placing unit to process the substrate;
a flow passage forming member forming, on a peripheral side of the cup with respect to the substrate within the cup, a first exhaust passage, a scattered substance collection passage configured to collect a scattered substance from the substrate, and a second exhaust passage, which are separated from each other, in sequence as going upwards, each of the first exhaust passage, the scattered substance collection passage and the second exhaust passage being an annular passage opened toward a central axis side of the cup and surrounding the substrate which is placed in the placing unit and supplied with the processing liquid;
a joint exhaust passage connected to each of the first exhaust passage, the scattered substance collection passage, and the second exhaust passage, the first exhaust passage, the scattered substance collection passage, and the second exhaust passage being evacuated simultaneously toward the peripheral side of the cup, and the joint exhaust passage being disposed below the substrate within the cup;
a first annular member included in the flow passage forming member, and formed along an outer periphery of the substrate, the scattered substance collection passage and the first exhaust passage being formed above and below the first annular member, respectively; and
a communication hole provided in the flow passage forming member to allow the scattered substance collection passage and the joint exhaust passage to communicate with each other, a pressure loss of the communication hole being large as compared to a pressure loss in a gap formed between the first annular member and the substrate.

8. The liquid processing apparatus of claim 7,
wherein the flow passage forming member comprises:
an upper wall extending, in a space above the first annular member, toward a central axis of the cup from a side wall of the cup to form an opening of the cup; and
a second annular member disposed above the first annular member, the scattered substance collection passage and the second exhaust passage being formed between the second annular member and the first annular member and between the second annular member and the upper wall, respectively.

9. The liquid processing apparatus of claim 8,
wherein an inner peripheral end of the upper wall is located closer to the peripheral side of the cup than an inner peripheral end of the second annular member is.

10. The liquid processing apparatus of claim 7,
wherein the first annular member extends upwards as going toward a central axis of the cup, and
an inclination of the first annular member with respect to a horizontal plane is smaller on the central axis side of the cup than on the peripheral side of the cup.

11. The liquid processing apparatus of claim 10,
wherein an inner peripheral end portion of the first annular member extends downwards from above the substrate as going toward the central axis of the cup.

12. The liquid processing apparatus of claim 7,
wherein a width of a downstream side of the first exhaust passage is larger than a width of an upstream side of the first exhaust passage, when viewed from a side.

13. A liquid processing method of processing a substrate while surrounding the substrate with a cup, the liquid processing method comprising:
placing the substrate in a placing unit within the cup equipped with a flow passage forming member, the flow passage forming member forming, on a peripheral side of the cup with respect to the substrate within the cup, a first exhaust passage, a scattered substance collection passage configured to collect a scattered substance from the substrate, and a second exhaust passage, which are separated from each other, in sequence as going upwards, each of the first exhaust passage, the scattered substance collection passage and the second exhaust passage being an annular passage opened toward a central axis side of the cup;
evacuating, by evacuating a joint exhaust passage disposed below the substrate within the cup, the first exhaust passage, the scattered substance collection passage, and the second exhaust passage simultaneously, that are respectively connected to the joint exhaust passage, toward the peripheral side of the cup; and evacuating the scattered substance collection passage through a communication hole, that is provided in the flow passage forming member to allow the scattered substance collection passage and the joint exhaust passage to communicate with each other, such that a pressure loss of the communication hole is large as compared to a pressure loss in a gap formed between the substrate and a first annular member, the first annular member being included in the flow passage forming member, and being formed along an outer periphery of the substrate, the scattered substance collection passage and the first exhaust passage being formed above and below the first annular member, respectively, and the evacuating of the scattered substance collection passage being included in the evacuating of the first exhaust passage, the scattered substance collection passage, and the second exhaust passage simultaneously.

* * * * *